United States Patent
Srivastava

(10) Patent No.: US 7,892,357 B2
(45) Date of Patent: Feb. 22, 2011

(54) GAS DISTRIBUTION PLATE ASSEMBLY FOR PLASMA REACTORS

(75) Inventor: Aseem K. Srivastava, Germantown, MD (US)

(73) Assignee: Axcelis Technologies, Inc., Santa Clara, CA (US)

( * ) Notice: Subject to any disclaimer, the term of this patent is extended or adjusted under 35 U.S.C. 154(b) by 1286 days.

(21) Appl. No.: 10/755,617

(22) Filed: Jan. 12, 2004

(65) Prior Publication Data

US 2005/0150601 A1    Jul. 14, 2005

(51) Int. Cl.
*C23C 16/455* (2006.01)
*C23C 16/44* (2006.01)
*C23C 16/06* (2006.01)
*C23C 16/22* (2006.01)

(52) U.S. Cl. .................................. 118/715; 156/345.1

(58) Field of Classification Search ............... 118/715, 118/728; 156/345.29, 345.33–345.36, 345.1
See application file for complete search history.

(56) References Cited

U.S. PATENT DOCUMENTS

| | | | | |
|---|---|---|---|---|
| 4,612,077 A | * | 9/1986 | Tracy et al. | 156/345.34 |
| 5,272,417 A | * | 12/1993 | Ohmi | 315/111.21 |
| 5,449,410 A | | 9/1995 | Chang et al. | 118/723 ER |
| 5,643,394 A | * | 7/1997 | Maydan et al. | 156/345.33 |
| 5,968,275 A | * | 10/1999 | Lee et al. | 118/723 R |
| 6,024,799 A | * | 2/2000 | Chen et al. | 118/715 |
| 6,225,745 B1 | * | 5/2001 | Srivastava | 315/111.51 |
| 6,259,072 B1 | * | 7/2001 | Kinnard et al. | 219/486 |
| 6,415,736 B1 | * | 7/2002 | Hao et al. | 118/723 E |
| 6,537,419 B1 | * | 3/2003 | Kinnard | 156/345.34 |
| 6,547,458 B1 | * | 4/2003 | Janos et al. | 396/611 |
| 6,576,062 B2 | * | 6/2003 | Matsuse | 118/719 |
| 6,635,117 B1 | * | 10/2003 | Kinnard et al. | 118/724 |
| 6,761,796 B2 | * | 7/2004 | Srivastava et al. | 156/345.38 |
| 2005/0186680 A1 | * | 8/2005 | Pingree et al. | 436/149 |

FOREIGN PATENT DOCUMENTS

JP     10158844 A  *  6/1998
JP   2001203195 A  *  7/2001

* cited by examiner

*Primary Examiner*—Rudy Zervigon
(74) *Attorney, Agent, or Firm*—Cantor Colburn LLP

(57) ABSTRACT

A baffle plate assembly for distributing gas flows into an adjacent process chamber containing a semiconductor wafer to be processed includes a planar gas distribution portion having a plurality of apertures therein; a flange surrounding the gas distribution portion; and an impingement device centrally attached to the gas distribution portion, wherein the device includes a cap and a stem, the stem being in thermal contact with the gas distribution portion. Also disclosed herein are plasma reactors employing the baffle plate assembly and methods for reducing recombination of species in a plasma.

26 Claims, 5 Drawing Sheets

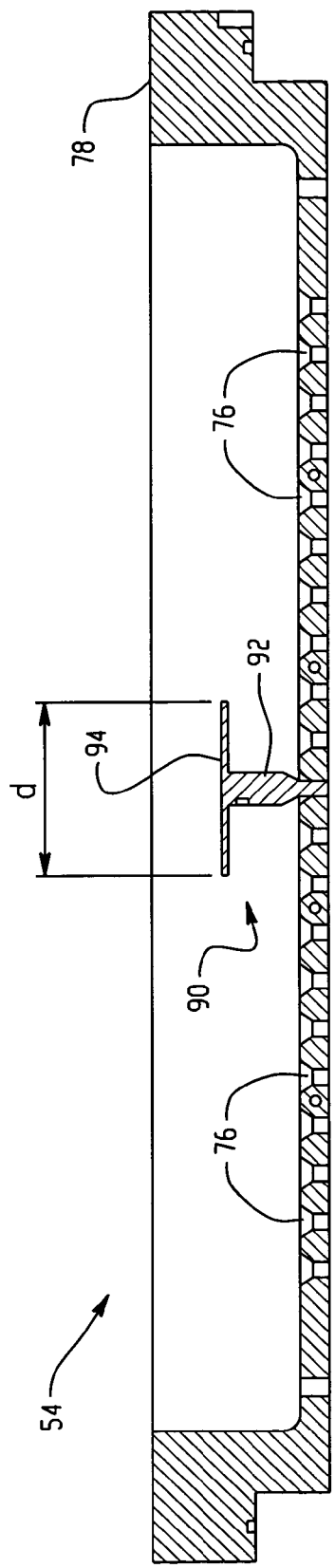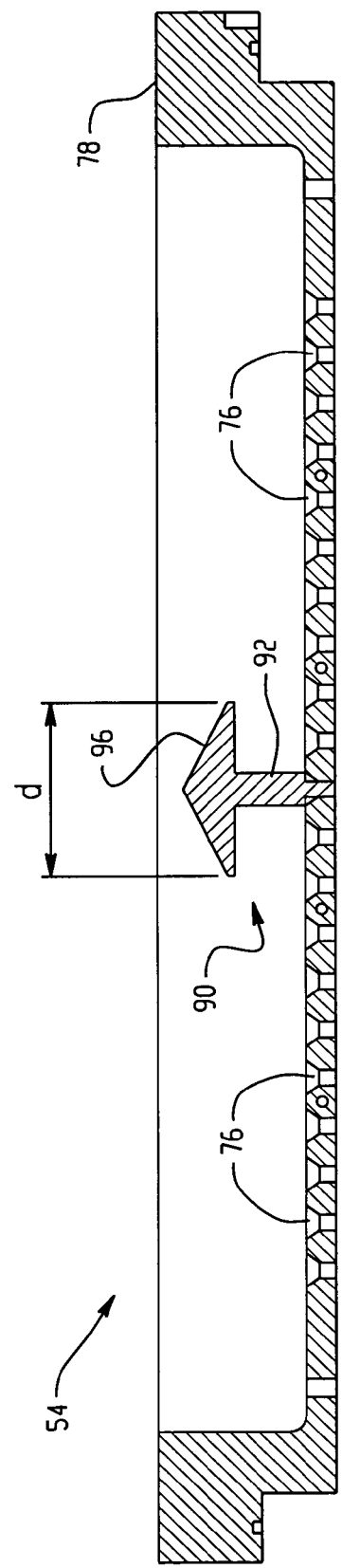

GAS DISTRIBUTION PLATE ASSEMBLY FOR PLASMA REACTORS

BACKGROUND

The present disclosure relates generally to semiconductor plasma processing systems such as plasma reactors, and more specifically, to a gas distribution plate assembly for reducing recombination of species in a plasma environment, among others.

In the manufacture of integrated circuits, photolithography techniques are used to form integrated circuit patterns on a substrate, such as a silicon wafer. Typically, the substrate is coated with a photoresist, portions of which are exposed to activating radiation through a mask to image a desired circuit pattern on the photoresist. In the case of negative acting photoresists, the portions of the photoresist left unexposed to the activating radiation are removed by a processing solution, leaving only the exposed portions on the substrate. In the case of positive acting photoresists, the portions of the photoresist exposed to the activating radiation are removed by a processing solution, leaving only the unexposed portions on the substrate.

After subsequent processing, in which the integrated circuit components are formed, it is generally necessary to remove the patterned photoresist from the wafer. In addition, residue that has been introduced on the substrate surface through the subsequent processing such as etching must be removed. Typically, the photoresist is "ashed" or "burned" and the ashed or burned photoresist, along with the residue, is "stripped" or "cleaned" from the surface of the substrate. One manner of removing photoresist and residues is by rapidly heating the photoresist-covered substrate in a vacuum chamber to a preset temperature by infrared radiation, and directing a microwave-energized reactive plasma toward the heated substrate surface. In the resulting photoresist ashing process, wherein the reactive plasma reacts with the photoresist, the hot reactive gases in the plasma add heat to the surface of the substrate by means of convection. Heat energy on the order of 100 milliwatts per square centimeter (mW/cm$^2$) is also added to the wafer as a result of the surface reaction. Excessive heat on the surface of the wafer can damage devices or portions thereof that have been formed on or in the wafer. In addition, excessive heat on the surface of the wafer can cause photoresist popping during subsequent processing, for example, during high-dose ion implanted (HDII) wafer ash processes, which could lead to unwanted particles on the wafer, causing device damage.

Reducing the temperature of the ashing process in the chamber will slow the reaction rate and thus the amount of heat added to the wafer by the surface reaction. Also, as the reaction rate slows, the rate of resist removal drops as well, leading to a reduction in throughput (defined as the number of wafers processed through the machine per unit of time). However, the gas temperature, which is a function of the gas mixture and the applied microwave power, will remain unaffected by the reduced process temperature. The problem is exacerbated if the process includes a reaction catalyst such as carbon tetrafluoride ($CF_4$), which tends to increase the rate of reaction due to increased production of atomic oxygen. As a result, the catalyst-assisted process results in higher temperature gases, even at lower process temperatures.

A typical plasma processing apparatus is shown in U.S. Pat. No. 5,449,410 to Chang et al. wherein a baffle plate or showerhead is provided for distributing gas into a plasma chamber. The baffle plate is generally of a single or dual baffle plate configuration. An impingement plate may also be employed. The single baffle plate is generally fabricated from C-276 aluminum ultra pure alloy, which significantly adds to the costs of the reactor. The dual baffle plate generally includes a lower baffle plate fabricated from aluminum and an upper baffle plate fabricated from quartz, which may be further coated with a sapphire coating, which prevents the quartz from being etched in a fluorine environment.

Problems with the baffle plates are well known. For example, the sapphire coating on sapphire coated quartz baffle plates has a tendency to flake off during use requiring replacement. If left uncoated, the energetic species generated in the plasma, e.g., fluorine, can etch the baffle plate, thereby affecting flow patterns onto the substrate. In addition, the temperature of a quartz baffle plate can be difficult to control if IR wavelength energy is absorbed from the wafer with no means for sinking or dissipating the absorbed radiant energy. Impingement plates are generally formed of ceramic, which has a tendency to crack during use, leading to particle contamination as well as expensive preventative maintenance and repair schedule to properly clean the chamber.

Another problem with prior art baffle plates is with the relatively high gas flow rates required to produce effective ashing rates. For example, about 10 to about 12 standard liters per minute (slm) of total gas flow is typical for achieving effective ash rates and uniformity on 300 millimeter (mm) substrates. While the costs for gases such as oxygen and nitrogen are relatively inexpensive, costs for specialty gases become a concern at these high flow rates. Specialty gases, such as ultra high purity mixtures of hydrogen and some noble gas, are generally required for removing photoresist from substrates including low k dielectrics. The use of these gases can become cost prohibitive at these high gas flow rates.

Moreover, high gas flow rates tend to require very large pumps and vacuum lines to provide adequate chamber pressure. One of the reasons as to why high gas flow rates are employed is that while the plasma source upstream of the chamber generates a large number of reactive products, a majority of these species tends to recombine and release energy during the recombination. Recombination occurs in the volume of the plasma (and afterglow if the pressure is high enough) or on the surfaces of the chamber, the baffle plates, and plenums. Recombination changes the reactive characteristics of the plasma. For example, reactive atomic species that recombine into their molecular form become completely inert and non-reactive, thereby affecting the efficiency with which the ashing process is conducted.

Data taken by quartz microbalance indicate that atomic oxygen species at the wafer surface are on the order of about $10^{12}$ cm$^{-3}$ at a pressure of about 1 Torr in the chamber. Since neutral density at that pressure is about $10^{16}$cm$^{-3}$, the atomic oxygen concentration is about four orders of magnitude lower than the neutral concentration at the wafer surface. While the exact concentration of atomic oxygen is not known in the generation region, it can be presumed that a significant portion of the incoming oxygen gas flowing into the generator is dissociated into atomic oxygen, among other species, which becomes depleted as the species traverse through a plenum and one or two baffle plates to the substrate surface. This reduction is believed to be primarily due to the recombination of atomic oxygen on the baffle plate and chambers surfaces, as previously described.

Accordingly, there is a continuing need in the art for improvements to the plasma reactor, specifically by reducing the number of recombination sites within the plasma reactor while maintaining ash rate and non-uniformity of the process. The present disclosure is directed to a baffle plate configuration overcoming the problems noted in the prior art by reducing the number of recombination sites within the plasma reactor while maintaining ash rate and non-uniformity of the process. Because the number of recombination sites is reduced, lower gas flows can be employed while maintaining ash rate and non-uniformity of the process. This in turn could lead to a reduction in pump and vacuum hardware cost.

BRIEF SUMMARY

The present disclosure is directed to a baffle plate assembly for distributing gas flows into an adjacent process chamber containing a semiconductor wafer to be processed, comprising a planar gas distribution portion having a plurality of apertures therein; a flange surrounding the gas distribution portion; and an impingement device centrally attached to the gas distribution portion, wherein the device includes a cap and a stem, the stem being in thermal contact with the gas distribution portion.

A downstream plasma asher comprises a plasma generator; a process chamber downstream from the plasma generator, the process chamber comprising an opening for receiving plasma from the plasma generator into the process chamber, and a substrate supported within the process chamber; and a baffle plate assembly intermediate the substrate and the process chamber opening for distributing plasma flow in the process chamber, the baffle plate assembly comprising a planar gas distribution portion having a plurality of apertures therein; a flange surrounding the gas distribution portion; and an impingement device centrally attached to the gas distribution portion, wherein the device includes a cap and a stem, the cap having a diameter about equal to a diameter of the process chamber opening and the stem in thermal contact with the gas distribution portion.

A process for minimizing recombination of species in a plasma ashing process comprises installing a baffle plate assembly intermediate a plasma generating region and a substrate to be processed, the baffle plate assembly comprising a planar gas distribution portion having a plurality of apertures therein; a flange surrounding the gas distribution portion; and an impingement device centrally attached to the gas distribution portion, wherein the impingement device includes a cap and a stem, the stem being in thermal contact with the gas distribution portion; and flowing plasma through and about the baffle plate assembly and onto the substrate.

Other embodiments of the disclosure are contemplated to provide particular features and structural variants of the basic elements. The specific embodiments referred to as well as possible variations and the various features and advantages of the disclosure will become better understood when considered in connection with the detailed description and drawings that follow.

BRIEF DESCRIPTION OF THE DRAWINGS

Referring now to the figures, which are exemplary embodiments and wherein the like elements are numbered alike:

FIG. 3 is a cross sectional view of the gas distribution plate assembly of FIG. 2 taken along lines 3-3;

FIG. 4 is a cross sectional view of a gas distribution plate assembly in accordance with another embodiment;

DETAILED DESCRIPTION

Figure 1:
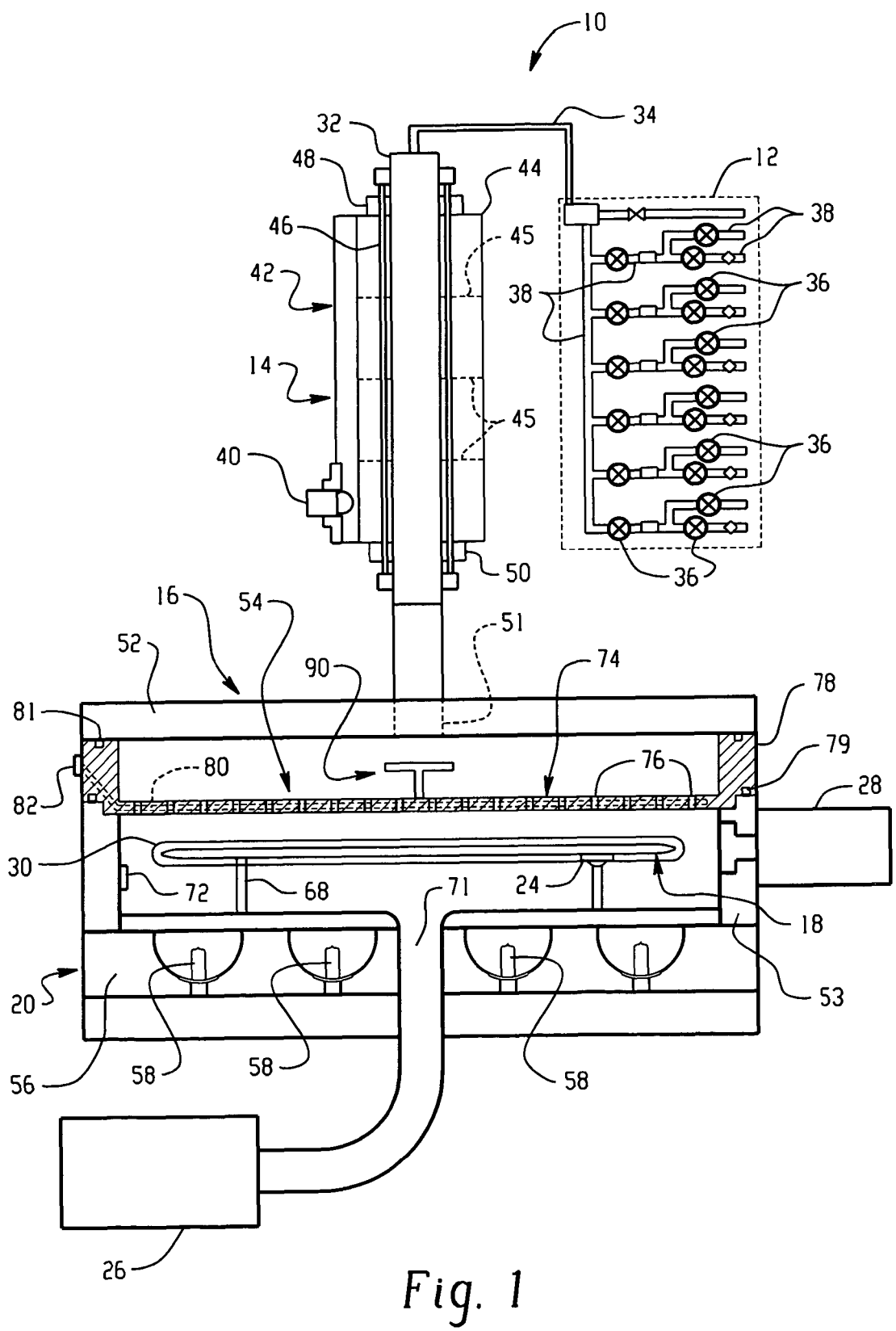
FIG. 1 is a sectional view of a photoresist asher including a gas distribution plate assembly constructed in accordance with one embodiment.
Figure 2:
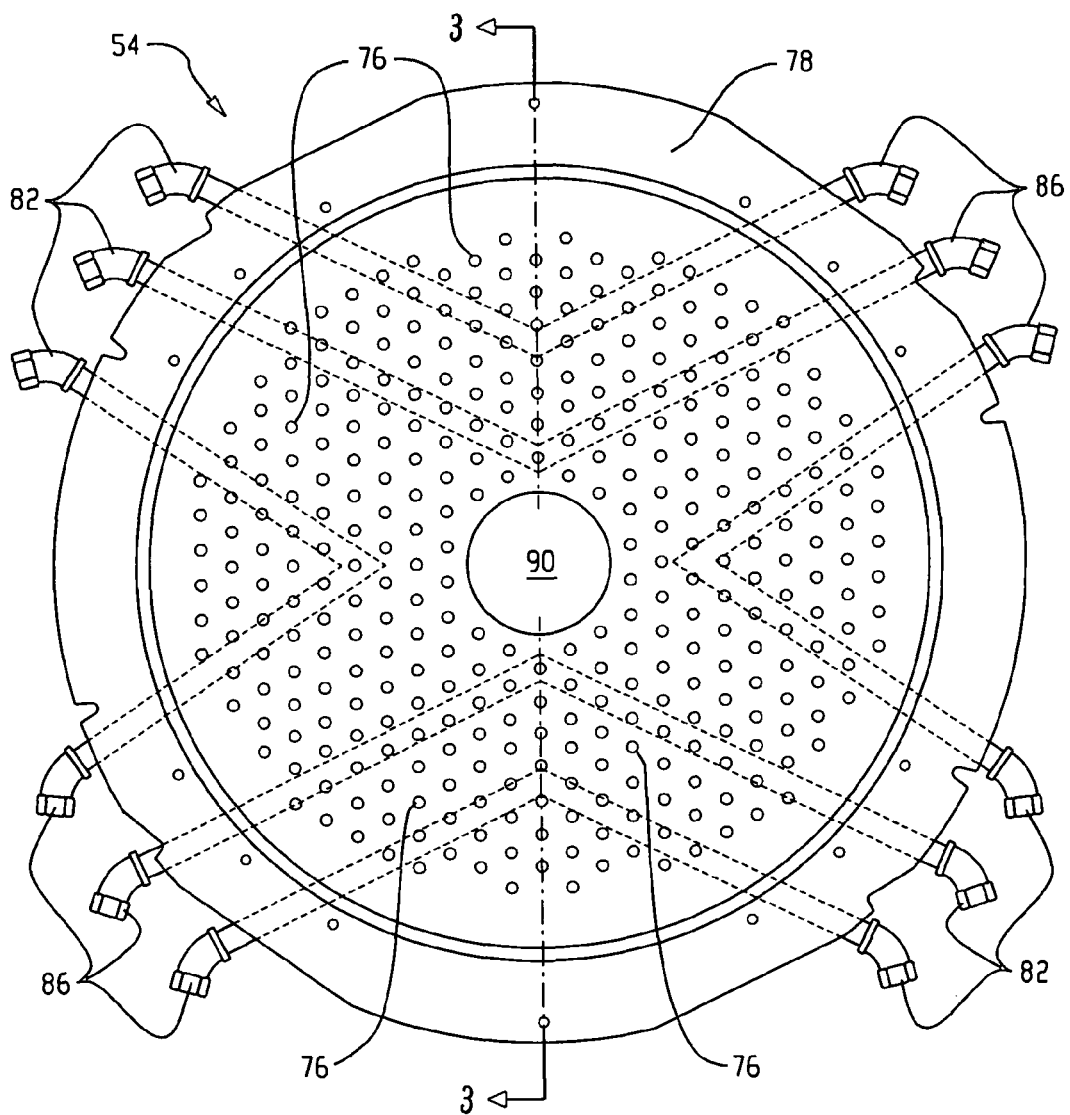
FIG. 2 is a plan view of the gas distribution plate assembly of FIG. 1.

Referring now to the drawings, FIG. 1 discloses a photoresist asher 10, comprising a gas box 12; a microwave plasma generator assembly 14; a process chamber 16 defining an interior cavity in which is heated a semiconductor substrate such as a wafer 18; and a radiant heater assembly 20 for heating the wafer 18, situated at the bottom of the process chamber. A temperature probe 24, such as a thermocouple, is used to monitor the temperature of the wafer 18 (also referred to herein as the substrate). A vacuum pump 26 is used to evacuate the process chamber 16 for processes requiring vacuum conditions. Although reference is made to a microwave plasma generator assembly, other plasma generators are suitable for use in the present disclosure, such as for example, radiofrequency (RF) plasma generators, inductively coupled plasma generators, combination RF and microwave plasma generators, and the like Additionally, while reference is made to radiant heating of the substrate, other heating mechanisms like ultra-violet energy, or hot plates (known as heating chucks) may also be employed. The present disclosure is not intended to be limited to any particular plasma generator or substrate heating mechanism.

A monochromator 28 is used to monitor the optical emission characteristics of gases within the chamber to aid in process endpoint determination. The wafer 18 is introduced into and removed from the process chamber via an appropriate load lock mechanism (not shown) via entry/exit passageway 30. Although the present disclosure is shown as being implemented within a photoresist asher, it may also be used in other semiconductor manufacturing equipment, such as residue removal and strip processes.

In operation, a desired mixture of gases is introduced into a plasma tube 32 from gas box 12 through an inlet conduit 34. The plasma tube 32 is preferably made of alumina ($Al_2O_3$) or sapphire to accommodate fluorine chemistries without etching or other degradation. In applications where fluorine is not to be used, the plasma tube could be made of quartz. The gases forming the desired mixture are stored in separate supplies (not shown) and mixed in the gas box 12 by means of valves 36 and piping 38. One example of a commonly used gas mixture is forming gas (primarily nitrogen with a small percentage of hydrogen), and oxygen. A fluorine containing gas such as carbon tetrafluoride ($CF_4$) may also be added to the gas mixture to increase ashing rates for certain processes.

The gas mixture is energized by the microwave plasma generator assembly 14 to form reactive plasma that will ash photoresist on the wafer 18 in the process chamber 16 when heated by the radiant heater assembly 20. A magnetron 40 generates microwave energy that is coupled to a waveguide 42. Microwave energy is fed from the waveguide through apertures (not shown) in microwave enclosure 44, which surrounds the plasma tube 32.

An outer quartz cooling tube 46 surrounds the plasma tube 32, slightly separated therefrom. Pressurized air is fed into the gap between the tubes 32 and 46 to effectively cool the tube 32 during operation. Alternately, cooling liquids that do not absorb microwave radiation may be used in place of the pressurized air. The microwave enclosure 44 is segmented into sections shown by phantom lines 45. Segmentation of the enclosure 44 allows uniform microwave power distribution across the length of the quartz, alumina or sapphire plasma tube 32, and protects it from overheating by preventing an unacceptably large thermal gradient from developing along its axial length when suitable input power is provided. Each segment of the enclosure 44 is separately fed with microwave energy that passes through the quartz tube 46 and the alumna or sapphire tube 32 passing therethrough.

The gas mixture within the plasma tube 32 is energized to create plasma. Microwave traps 48 and 50 are provided at the ends of the microwave enclosure 44 to prevent microwave leakage. Energized plasma enters the process chamber 16 through an opening 51 in the top wall 52 thereof.

Positioned between the top wall 52 of the plasma chamber 16 and the wafer 18 being processed is a gas distribution plate assembly 54 (also referred to as baffle plate assembly). In one embodiment, the gas distribution plate assembly 54 provides means for cooling the gases within the plasma to achieve desired process results. The baffle plate assembly 54 comprises a generally planar gas distribution central portion 74 having apertures 76 therein, surrounded by a flange 78, and an impingement device 90 attached to the gas distribution central portion 74. The flange 78 surrounds the central portion and seats intermediate the process chamber sidewall 53 and top wall 52. Seals 79 and 81, respectively, provide airtight connections between the flange 78 and the sidewall 53, and between the flange 78 and the top wall 52. The seals 79 and 81 reside in grooves located in the flange 78. The flange 78 also provides mounting holes for mounting to the top wall 52 and sidewall 53.

The impingement device 90 generally includes a stem portion 92 having one end fixedly attached to the gas distribution central portion 74 and an apertureless cap 94 that is attached to the other end of the stem (shown more clearly in FIG. 3). The cap 94 is preferably dimensioned to prevent direct impingement of plasma from the plasma generator onto the substrate 18 as well as to protect the substrate from line of sight exposure to UV light produced during plasma generation. As such, the cap has a diameter "d" that is slightly greater than or at about the same diameter as the opening 51 of the plasma chamber.

Positioned between the top wall 52 of the plasma chamber 16 and the wafer 18 being processed is a gas distribution plate assembly 54 (also referred to as baffle plate assembly). In one embodiment, the gas distribution plate assembly 54 provides means for cooling the gases within the plasma to achieve desired process results. The baffle plate assembly 54 comprises a generally planar gas distribution central portion 74 (also referred to herein as the gas distribution portion) having apertures 76 therein, surrounded by a flange 78, and an impingement device 90 attached to the gas distribution central portion 74. The flange 78 surrounds the central portion and seats intermediate the process chamber sidewall 53 and top wall 52. Seals 79 and 81, respectively, provide airtight connections between the flange 78 and the sidewall 53, and between the flange 78 and the top wall 52. The seals 79 and 81 reside in grooves located in the flange 78. The flange 78 also provides mounting holes for mounting to the top wall 52 and sidewall 53.

The cooling passages 80 may extend from the flange 78 into and about the central portion 74 in a configuration that avoids intersection with any of the apertures 76. Still further, the cooling passages 80 may also extend into the process chamber top wall, if desired. These individual cooling subsystems of these structural components (i.e., baffle plate, side walls and top wall) function to reduce the operating temperatures thereof. The cooling subsystems may either share a single gas or liquid coolant circulating system, or may be provided with independent circulating systems (gas or liquid) so as to provide independent temperature control and individual flow control thereof. Also, in embodiments of the disclosure wherein active cooling of the process chamber side walls and top wall are also provided, by maintaining these chamber surfaces at between about 15° C. to about 30° C. (just above the dew point), the wafer 18 can remain sufficiently cool to prevent photoresist popping during, for example, high-density ion implanted wafer ash processes.

In operation, the reactive plasma passes through the baffle plate 54 and ashes the photoresist on the wafer 18. The radiant heater assembly 20 comprises a plurality of tungsten halogen lamps 58 residing in a reflector 56 that reflects and redirects the heat generated by the lamps toward the backside of the wafer 18 positioned within the process chamber 16 on quartz or ceramic pins 68. One or more temperature sensors 72, such as thermocouples, are mounted on the interior of process chamber sidewall 53 to provide an indication of wall temperature.

The baffle plate assembly 54 shown in the photoresist asher 10 of FIG. 1 is shown in greater detail in FIG. 3. As previously discussed, the baffle plate 54 generally comprises the planar central apertured portion 74 and the flange 78. Located at the center of the planar central apertured portion 74 is the impingement device 90. The impingement device 90 diverts energized gases emanating from the plasma tube 32 radially outward to the remaining apertured area of the central apertured portion 74, so as to prevent direct impingement of atomic species on the wafer 18 being processed and also to prevent overheating of the planar central apertured portion 74 that would result without the impingement device 90.

The impingement device 90 includes a cap portion 94 and a stem portion 92. The cap 94 is spaced apart from the central apertured portion 74 so as to minimize heat transfer to the central apertured portion 74 that may occur from direct plasma impingement. In one embodiment, the cap 94 includes a generally planar impingement surface. Preferably, the stem portion 92 is removably attached to the central apertured portion 74 so as to provide ease of replacement if repairs are necessary. For example, the stem 92 may include a threaded portion and be threadingly mated to a complementary threaded opening in the planar central apertured portion 74. The stem 92 is actively cooled during operation by the cooling passages 80 provided in the central apertured portion 74 so as to further minimize heat transfer from the cap 94 to the central apertured portion 74. Advantageously, the single baffle plate assembly 54 with a small impingement device in place of a full size first baffle plate minimizes the surfaces available for species recombination, thereby permitting lower gas flows, and lower pressures while maintaining equivalent ashing rates and uniformities. This represents a significant commercial advantage over the prior art. For example, smaller pumps and vacuum lines can now be used.

Figure 5:
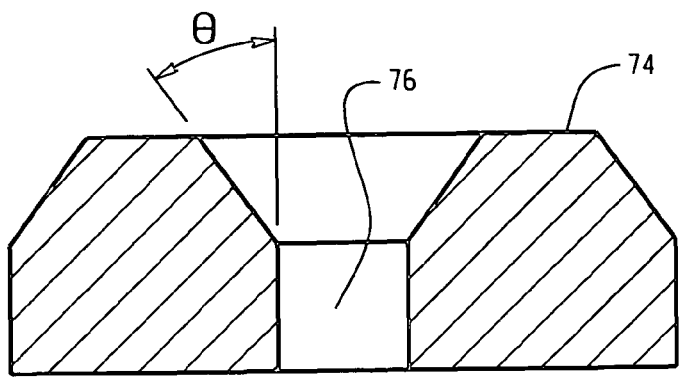
FIG. 5 is an enlarged cross sectional view of an aperture in the gas distribution plate assemblies.

As shown more clearly in FIG. 5, the shape of each one of the apertures 76 in the central apertured portion 74 preferably includes a frustoconical shaped portion facing the top wall 52 and a substantially straight shaped portion facing the substrate 18. The angle $\theta$ defining the frustoconical portion is preferably about 30 to about 60 degrees. In a preferred embodiment, the angle θ defining the frustoconical portion is at about 45 degrees. In this manner, pressure is greater in the space generally defined by the top wall 52 and the central apertured portion 74 than the space generally defined by the central apertured portion 74 and the substrate 18, thereby providing a downward flow of reactive species onto the substrate. As such, the use of lower operating pressures can be used and still maintain a sufficient pressure differential so as to provide uniform ashing rates across the substrate 18.

In one embodiment, the single baffle plate and impingement device assembly 54 are fabricated from aluminum. Suitable aluminum alloys are C-276 commercially available from Alcoa, Incorporated. Advantageously, this eliminates problems noted in the prior art with regard to sapphire coated quartz materials, which tend to flake off during prolonged operation. Moreover, fabricating the impingement device 90 from aluminum eliminates the problems associated with breakage of the ceramic impingement plates noted in the prior art. Still further, the use of aluminum blocks a large percentage of ultraviolet radiation from impacting the substrate, which would otherwise make temperature control more difficult and possibly cause wafer device damage. Operating at a uniform surface temperature and minimizing exposure to UV radiation provides a substantial improvement in reaction rate uniformity across the surface of the wafer. In addition, maintaining a consistent baffle plate temperature eliminates the "first wafer effects" due to parasitic heating of the baffle plate as successive wafers are placed in the process chamber and heated to process temperature by the radiant heating system.

In an alternative embodiment where fluorine is not being used, the single baffle plate and impingement device assembly 54 are fabricated from quartz or fused silica. The use of quartz reduces manufacturing costs relative to the use of ultra pure aluminum alloys. Thus, depending on the application (use of fluorine, or not), there are two alternative types of materials that can be employed for fabricating the single baffle plate and impingement device assembly 54 and still realize the benefits that occur from minimizing species recombination, e.g., lower gas flows, lower operating pressures, while providing equivalent ashing rates and uniformities.

In another embodiment, as shown in FIG. 4, the impingement device 90 includes a cap 96 that has an angled surface relative to the axial flow of atomic species from the plasma tube 32 into the process chamber. As shown, a cross sectional profile of the cap is generally triangular shaped and is preferably dimensioned so as to prevent direct ion impingement onto the underlying substrate 18. That is, diameter "d" is about the same as or slightly greater than the diameter provided by opening 51. Although this embodiment shows a substantially triangular cross-section, other designs such as a generally concave surface or a generally convex surface could also be used.

The disclosure is explained in more detail with reference to the following non-limiting Examples, which are only illustrative, but not limitative.

EXAMPLES

Example 1

In this example, ashing rate was measured for photoresist ashed using a conventional dual baffle plate design and compared to that for the same tool configured with a single aluminum baffle plate and impingement device assembly as shown in FIG. 3. The baffle plate assembly was positioned in the process chamber such that the apertured portion was at about the same position as the lower baffle plate in the commercial asher. The plasma asher was model number Radiant-Strip 320i commercially available from Axcelis Technologies, Incorporated, which included the conventional dual baffle plate assembly. During the comparative testing, the conventional dual baffle plate assembly was completely removed and replaced with the single aluminum baffle plate and impingement device assembly. Process conditions and photoresist were identical for each configured system with exceptions noted with regard to gas flow and operating pressure. Both systems were water cooled during operation. The microwave energized plasma was generated from a mixture of oxygen, forming gas (mostly nitrogen with a small percentage of hydrogen), and trickle flow of $CF_4$. In each case, five blank uncoated substrates were processed prior to ashing substrate containing the photoresist so as to bring the system to thermal equilibrium prior to starting the ash process. Table 1 provides the results.

TABLE 1

| Configuration | Total Gas Flow (slm) | Pressure (Torr) | Power (kilowatt) | Ashing Rate (microns/minute) | Non-uniformity (%) |
|---|---|---|---|---|---|
| Dual Baffle Plate | 10 | 1.2 | 3.8 | 7.34 | 4.41 |
| Single Baffle Aluminum | 4 | 0.8 | 3.8 | 7.35 | 4.21 |

Figure 6:
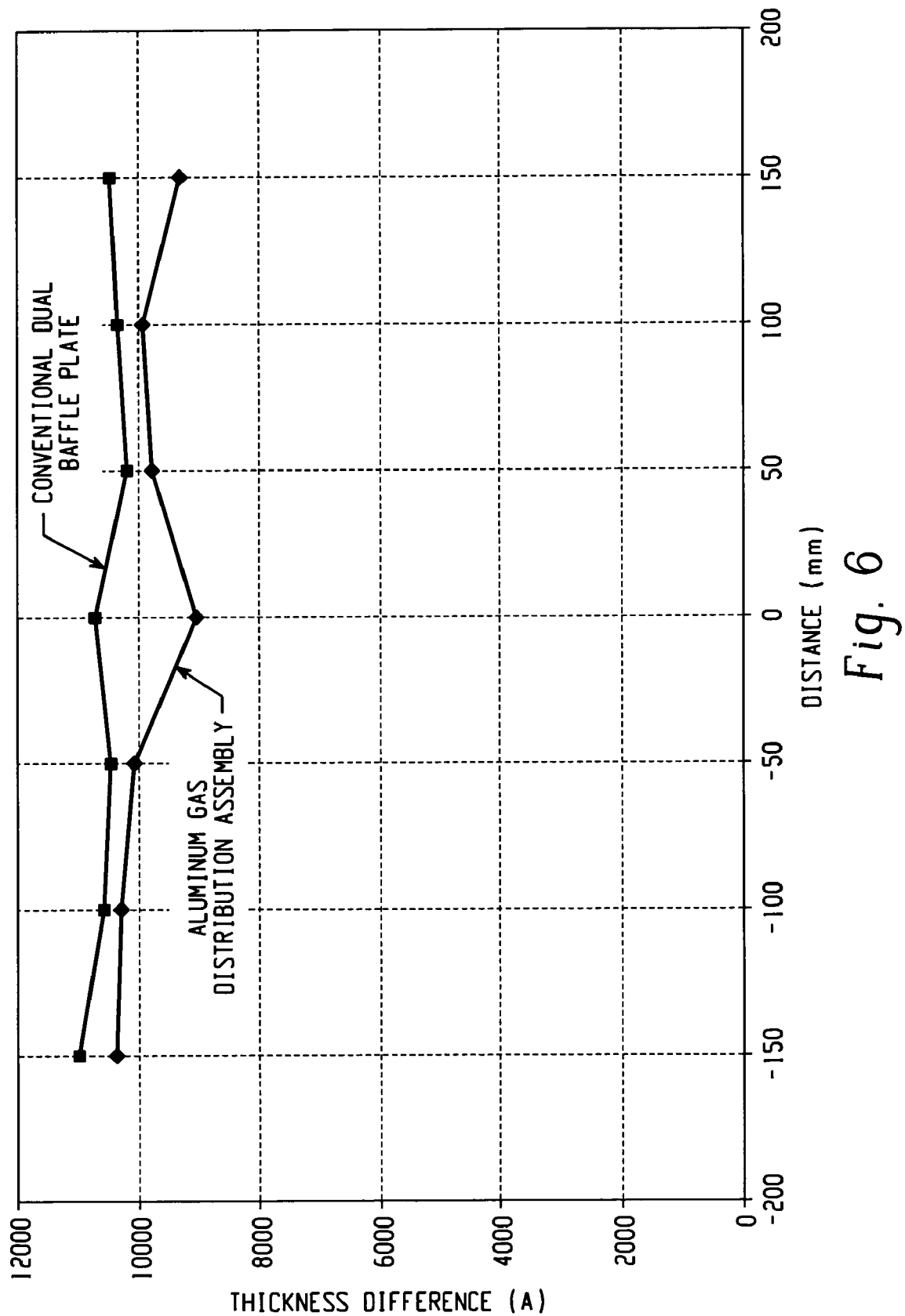
FIG. 6 graphically illustrates a diameter scan of a wafer measuring resist thickness difference (amount of resist removed for a given time) as a function of distance from a centerpoint of a substrate for an ashing process in a plasma asher employing one embodiment of the single baffle and impingement device apparatus in accordance with the present disclosure—an aluminum gas distribution plate assembly, as compared to a prior art dual baffle plate assembly.

The results clearly show that the use of the single aluminum baffle plate and impingement device assembly was substantially equivalent to the conventional dual baffle configuration in terms of ashing rate and non-uniformity. Total time to completely remove photoresist from the substrate was 18 seconds for the conventional design and 19 seconds for the single aluminum baffle plate and impingement device assembly. However, as shown in Table 1, gas flow rate and operating pressure was significantly less in the case of the single aluminum baffle plate assembly. FIG. 6 graphically illustrates diameter scans of resist removal rates for the standard flow of 10 slm to the flow of 4 slm. Although a very small quantity of resist remained at the central portion of the substrate using the single aluminum baffle plate assembly, it should be noted that the system was not fully optimized for the single aluminum baffle plate and impingement device assembly.

Example 2

In this example, ashing rate was compared for photoresist ashed using a conventional dual baffle design and the same tool configured with the single baffle plate assembly fabricated from quartz and an impingement device. The quartz baffle plate and impingement device assembly was positioned in the process chamber such that the apertured portion was at about the same position as the upper baffle plate in the commercial asher and was not water cooled. In each case five blank uncoated substrates were processed prior to ashing substrate containing the photoresist so as to bring the chamber to thermal equilibrium prior to starting the ash process. Table 2 provides the results.

TABLE 2

| Configuration | Total Gas Flow (slm) | Pressure (Torr) | Power (kilowatt) | Ashing Rate (microns/ minute) | Non-uniformity (%) |
|---|---|---|---|---|---|
| Dual Baffle Plate | 10 | 1.2 | 3.8 | 6.51 | 5.73 |
| Single Baffle Aluminum | 5 | 1.2 | 3.8 | 6.73 | 3.31 |

Figure 7:
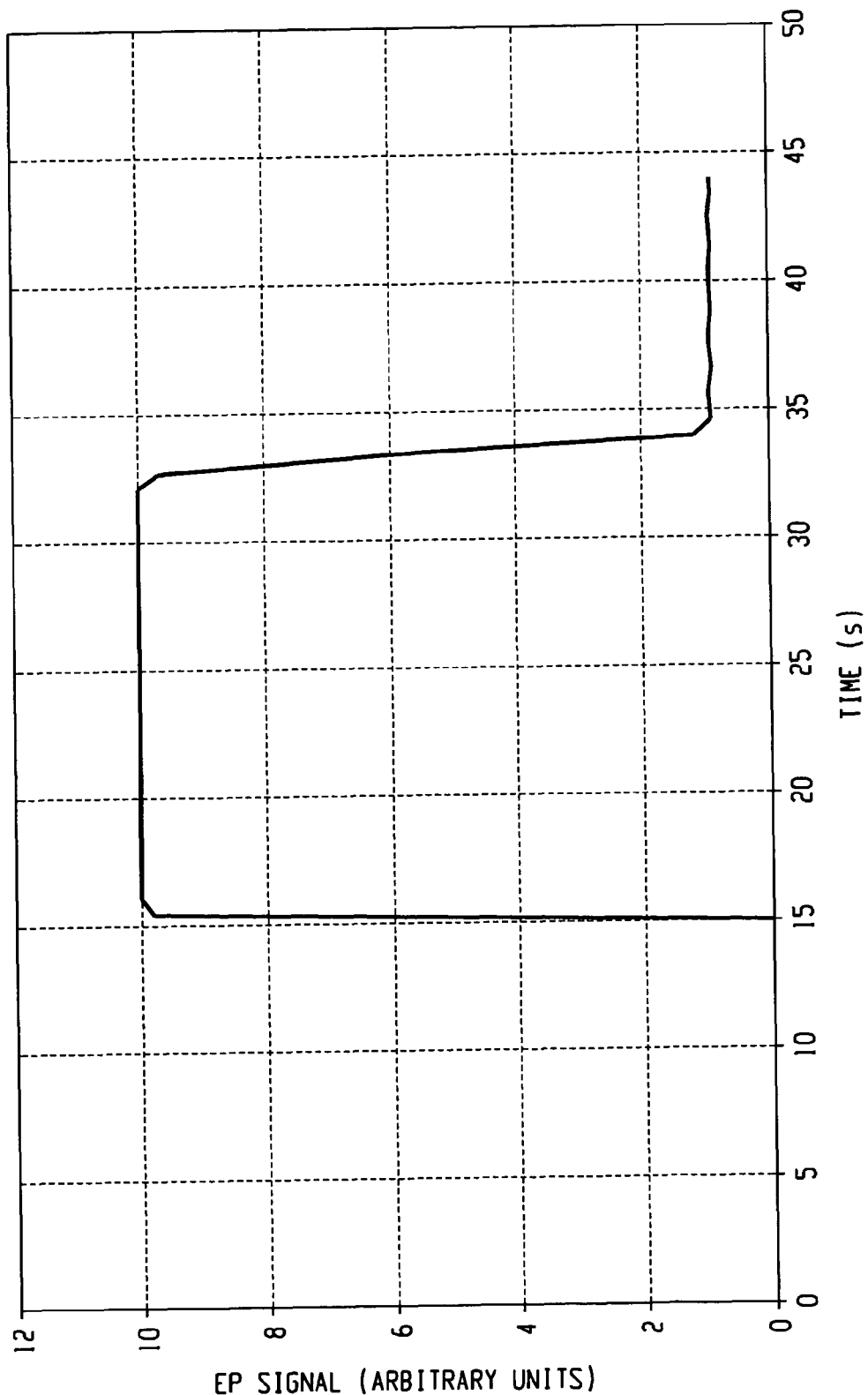
FIG. 7 graphically illustrates endpoint signal as a function of time for an ashing process in a plasma asher employing a second embodiment of the single baffle and impingement device apparatus in accordance with the present disclosure—a quartz gas distribution plate assembly.

Again, the use of the single baffle plate assembly with the integrated impingement device fabricated from quartz provided a reduction in gas flow rates while maintaining substantially equivalent ashing rates. Moreover, as observed, ashing non-uniformity appeared to significantly decrease from using the higher gas flow rates. FIG. 7 graphically illustrates an endpoint trace for the quartz baffle plate assembly. The sharp drop at about 32 seconds in the endpoint trace when ashing started at about 15 seconds indicates a very uniform removal of the photoresist, with a time to clear resist of about 17-18 seconds.

Advantageously, either of the two single baffle plate assemblies including the central apertured portion and the integrated impingement device disclosed herein do not sacrifice process performance compared to conventional two baffle plate designs. Relatively uniform ashing rates were achieved without significant optimization and it is believed that the single baffle plate assemblies provided herein promote uniform temperature profile across the substrate during plasma ashing. Both the quartz and the aluminum baffle plate assemblies permit lower gas flows; lower operating pressures; significantly reduced gas mixing costs; and solves some of the problems currently being encountered. Because of this, smaller pumps and vacuum lines can be employed leading to further cost reductions. Moreover, by minimizing the internal surface area that contacts the plasma during plasma ashing as provided by the gas distribution assemblies illustrated in FIGS. 3 and 4, surface recombination of species is minimized.

While the disclosure has been described with reference to an exemplary embodiment, it will be understood by those skilled in the art that various changes may be made and equivalents may be substituted for elements thereof without departing from the scope of the disclosure. In addition, many modifications may be made to adapt a particular situation or material to the teachings of the invention without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A baffle plate assembly for distributing gas flows into an adjacent process chamber containing a semiconductor wafer to be processed, comprising:
   a single generally circular planar gas distribution portion having a plurality of apertures therein;
   a flange surrounding the gas distribution portion; and
   an apertureless impingement device centrally attached to the gas distribution portion, wherein the device includes a generally circular cap and a stem, the stem being in thermal contact with the gas distribution portion.

2. The baffle plate assembly of claim 1, wherein the gas distribution portion, the flange, and the impingement device are fabricated from aluminum.

3. The baffle plate assembly of claim 1, wherein the gas distribution portion, the flange, and the impingement device are fabricated from quartz.

4. The baffle plate assembly of claim 1, wherein the gas distribution portion, the flange, and the impingement device are fabricated from sapphire coated quartz.

5. The baffle plate assembly of claim 1, wherein the cap has a planar impingement surface.

6. The baffle plate assembly of claim 1, wherein the cap has an angled impingement surface.

7. The baffle plate assembly of claim 1, wherein the cap has a substantially triangular cross sectional shape.

8. The baffle plate assembly of claim 1, wherein the cap has a concave surface.

9. The baffle plate assembly of claim 1, wherein the cap has a convex surface.

10. The baffle plate assembly of claim 1, wherein the plurality of apertures of the gas distribution portion have a frustoconical portion extending from a top surface to about a midpoint of the gas distribution portion, wherein the frustoconical portion has a first diameter at the top surface that narrows to a second diameter at about the midpoint and a substantially straight portion extending from the midpoint to a bottom surface of the gas distribution portion, wherein the substantially straight portion has the second diameter.

11. The baffle plate assembly of claim 1, wherein the gas distribution portion further comprises cooling passages machined therein for circulating a cooling medium therethrough.

12. The baffle plate assembly of claim 1, wherein the cap has a diameter about equal to a diameter of an opening for receiving plasma into a process chamber in which the baffle plate assembly is disposed.

13. A downstream plasma asher comprising:
   a plasma generator;
   a process chamber downstream from the plasma generator, the process chamber comprising an opening for receiving plasma from the plasma generator into the process chamber, and a substrate supported within the process chamber; and
   a baffle plate assembly intermediate the substrate and the process chamber opening for distributing plasma flow in the process chamber, the baffle plate assembly comprising a single generally circular planar gas distribution portion having a plurality of apertures therein; a flange surrounding the gas distribution portion; and an apertureless impingement device centrally attached to the gas distribution portion, wherein the device includes a generally circular cap and a stem, the cap having a diameter about equal to a diameter of the process chamber opening and the stem in thermal contact with the gas distribution portion.

14. The downstream plasma asher of claim 13, wherein the plasma generator is a selected from the group consisting of microwave plasma generator, a radiofrequency plasma generator, or a combination thereof.

15. The downstream plasma asher of claim 13, wherein the impingement device is removable.

16. The downstream plasma asher of claim 13, wherein the gas distribution portion, the flange, and the impingement device are fabricated from aluminum.

17. The downstream plasma asher of claim 13, wherein the gas distribution portion, the flange, and the impingement device are fabricated from quartz.

18. The downstream plasma asher of claim 13, wherein the gas distribution portion, the flange, and the impingement device are fabricated from sapphire coated quartz.

19. The downstream plasma asher of claim 13, wherein the cap has a planar impingement surface.

20. The downstream plasma asher of claim 13, wherein the cap has an angled impingement surface.

21. The downstream plasma asher of claim 13, wherein the cap has a substantially triangular cross sectional shape.

22. The downstream plasma asher of claim 13, wherein the cap has a concave surface.

23. The downstream plasma asher of claim 13, wherein the cap has a convex surface.

24. The downstream plasma asher of claim 13, wherein the plurality of apertures of the gas distribution portion have a frustoconical portion extending from a top surface to about a midpoint of the gas distribution portion, wherein the frustoconical portion has a first diameter at the top surface that narrows to a second diameter at about the midpoint, and a substantially straight portion extending from about the midpoint to a bottom surface of the gas distribution portion, wherein the substantially straight portion has the second diameter.

25. The downstream plasma asher of claim 13, wherein the gas distribution portion further comprises cooling passages machined therein for circulating a cooling medium therethrough.

26. The downstream plasma asher of claim 13, wherein a diameter of the gas distribution portion is about equal to a diameter of the substrate.

* * * * *

UNITED STATES PATENT AND TRADEMARK OFFICE
CERTIFICATE OF CORRECTION

| | | |
|---|---|---|
| PATENT NO. | : 7,892,357 B2 | Page 1 of 1 |
| APPLICATION NO. | : 10/755617 | |
| DATED | : February 22, 2011 | |
| INVENTOR(S) | : Aseem K. Srivastava | |

It is certified that error appears in the above-identified patent and that said Letters Patent is hereby corrected as shown below:

Title Page Item (73), Assignee, delete "Axcelis Technologies, Inc., Santa Clara, CA (US)" and insert therefor --Axcelis Technologies, Inc., Beverly, MA (US)--

Column 1: Line 40: "Millliwatts" should be spelled "Milliwatts"

Column 4: Line 32: "...generators, and the like Additionally, while..." should read "...generators, and the like. Additionally, while..."

Signed and Sealed this

Twenty-third Day of August, 2011

David J. Kappos
*Director of the United States Patent and Trademark Office*